US 7,563,653 B2

(12) United States Patent
Lee et al.

(10) Patent No.: US 7,563,653 B2
(45) Date of Patent: Jul. 21, 2009

(54) ESD PROTECTION FOR HIGH VOLTAGE APPLICATIONS

(75) Inventors: Jian-Hsing Lee, Hsin-Chu (TW); Deng-Shun Chang, Kaohsiung (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 0 days.

(21) Appl. No.: 12/113,803

(22) Filed: May 1, 2008

(65) Prior Publication Data

US 2008/0233686 A1 Sep. 25, 2008

Related U.S. Application Data

(62) Division of application No. 10/950,844, filed on Sep. 27, 2004, now Pat. No. 7,385,252.

(51) Int. Cl.
*H01L 21/332* (2006.01)
(52) U.S. Cl. .................. 438/133; 438/138; 438/142; 257/355; 257/E21.388; 257/E27.033
(58) Field of Classification Search .................. 438/133, 438/138, 142; 257/355, 356, 357, 360, E21.388, 257/E27.033
See application file for complete search history.

(56) References Cited

U.S. PATENT DOCUMENTS

| | | | |
|---|---|---|---|
| 5,416,351 A | 5/1995 | Ito et al. | |
| 5,631,793 A | 5/1997 | Ker et al. | |
| 6,066,879 A | 5/2000 | Lee et al. | |
| 6,097,064 A | 8/2000 | Saitoh et al. | |
| 6,281,554 B1 | 8/2001 | Pan | |
| 6,420,221 B1 * | 7/2002 | Lee et al. | 438/199 |
| 6,542,346 B1 | 4/2003 | Chen et al. | |
| 6,614,078 B2 | 9/2003 | Lee et al. | |
| 6,628,493 B1 | 9/2003 | Chen et al. | |
| 6,788,507 B2 | 9/2004 | Chen et al. | |
| 6,858,902 B1 | 2/2005 | Salling et al. | |
| 6,937,457 B2 | 8/2005 | Shih et al. | |
| 6,949,806 B2 | 9/2005 | Wu et al. | |
| 7,405,445 B2 * | 7/2008 | Huang et al. | 257/355 |
| 2002/0187601 A1 | 12/2002 | Lee et al. | |
| 2003/0047786 A1 * | 3/2003 | Lee et al. | 257/355 |
| 2005/0280091 A1 * | 12/2005 | Huang et al. | 257/355 |
| 2006/0043491 A1 | 3/2006 | Lee et al. | |

OTHER PUBLICATIONS

Nitin Mohan et al., "ESD Protection Design Methology in Deep Sub-micron CMOS Technology", Winter 2003, 47 pages, University of Waterloo, Waterloo, Ontario, Canada.

(Continued)

*Primary Examiner*—Sue Purvis
*Assistant Examiner*—Fazli Erdem
(74) *Attorney, Agent, or Firm*—Haynes and Boone, LLP

(57) ABSTRACT

An electrostatic discharge (ESD) protection device includes a diode located in a substrate and an N-type metal oxide semiconductor (NMOS) device located in the substrate adjacent the diode, wherein both the diode and the NMOS are coupled to an input device, and at least a portion of the diode and at least a portion of the NMOS device collectively form an ESD protection device.

5 Claims, 8 Drawing Sheets

OTHER PUBLICATIONS

Ajith Amerasekera et al., "Substrate Triggering and Salicide Effects on ESD Performance and Protection Circuit Design in Deep Submicron CMOS Processes", 1995, pp. 21.3.1-21.3.4, 0-7803-2700-4, IEEE.

K. Lozano et al., "Alignment and Mechanical Characterization of Vapor Grown Carbon Nanofibers in Polyethylene", 8 pages.

S. Paulson et al., "Tunable Resistance of a Carbon Nanotube—Graphite Interface", Dec. 1, 2000, pp. 1742-1744, vol. 290, www.sciencemag.org.

B. Q. Wei et al., "Reliability and Current Carrying Capacity of Carbon Nanotubes", Applied Physics Letters, Aug. 20, 2001, pp. 1172-1174, vol. 79, No. 8, American Institute of Physics, 0003-6951/2001/79(8)/1172/3.

Markus P.J. Mergens et al., "High Holding Current SCRs (HHI-SCR) for ESD Protection and Latch-Up Immune IC Operation", 2002, Saroff and ESD Association, 8 pages, EOS/ESD Symposium (paper 1A3).

\* cited by examiner

ESD PROTECTION FOR HIGH VOLTAGE APPLICATIONS

CROSS-REFERENCE

This application is a Divisional of U.S. Ser. No. 10/950, 844, filed Sep. 27, 2004, which is hereby incorporated by reference in their entirety.

This application is related to the following commonly-assigned U.S. patent applications, which both are hereby incorporated by reference in their entirety:

U.S. Ser. No. 10/694,129, filed Oct. 27, 2003, now U.S. Pat. No. 6,937,457 issued Aug. 30, 2005, entitled "Decoupling Capacitor"; and U.S. Ser. No. 10/687,314, filed Oct. 16, 2003, now U.S. Pat. No. 6,949,806, issued Sep. 27, 2005, entitled: "Electrostatic Discharge Protection Structure For Deep Sub-Micron Gate Oxide".

BACKGROUND

Many integrated circuits include electrostatic discharge (ESD) protection to prevent the serious damage that ESD can wreak. One application of ESD protection is to protect high voltage MOS devices from ESD events. High voltage MOS devices may use conventional ESD protection structure and mechanisms, such as a parasitic bipolar transistor or a silicon controlled rectifier (SCR). However, high voltage MOS devices may be damaged by an ESD zapping event even before the conventional ESD protection structure is turned on in high voltage MOS device applications.

BRIEF DESCRIPTION OF THE DRAWINGS

Aspects of the present disclosure are best understood from the following detailed description when read with the accompanying figures. It is emphasized that, in accordance with the standard practice in the industry, various features may not be drawn to scale. In fact, the dimensions of the various features may be arbitrarily increased or reduced for clarity of discussion.

DETAILED DESCRIPTION

Figure 1:
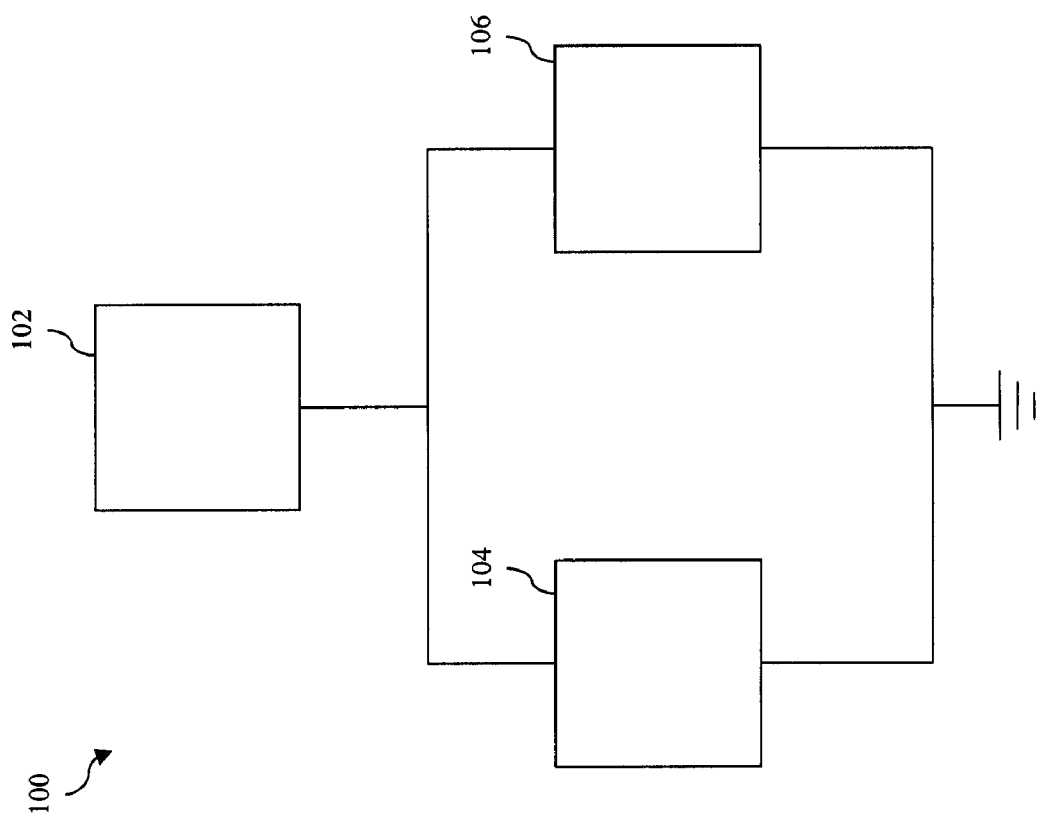
FIG. 1 is a schematic view of at least a portion of an embodiment of an integrated circuit device constructed according to aspects of the present disclosure.

It is to be understood that the following disclosure provides many different embodiments, or examples, for implementing different features of various embodiments. Specific examples of components and arrangements are described below to simplify the present disclosure. These are merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact.

Referring to FIG. 1, illustrated is a schematic view of at least a portion of one embodiment of an integrated circuit (IC) device 100 constructed according to aspects of the present disclosure. The IC device 100 includes an electrical input/output (I/O) device 102 and a microelectronic device 106 or other device which may require protection from electrostatic discharge (ESD) (hereafter referred to as an "ESD protected" device). The IC device 100 also includes an ESD protection device 104 electrically coupled in parallel with the I/O device 102 and the ESD protected device 106.

The I/O device 102 may be, comprise, or be coupled to a power supply or signal generator, or otherwise be configured to provide a power or data signal to the ESD protected device 106. The ESD protected device 106 may be or include one or more microelectronic devices, such as an n-type metal-oxide-semiconductor field effect transistor (NMOSFET or NMOS), a p-type metal-oxide-semiconductor field effect transistor (PMOSFET or PMOS), a complementary metal-oxide-semiconductor field effect transistor (CMOSFET or CMOS), a high voltage CMOS, an electrically programmable read only memory (EPROM) cell, an electrically erasable programmable read only memory (EEPROM) cell, a static random access memory (SRAM) cell, a dynamic random access memory (DRAM) cell, a single electron transistor (SET), a diode, a capacitor, an inductor, an integrated circuit (IC), other microelectronic devices, or arrays and/or combinations thereof.

The ESD protection device 104 is or includes a device adapted for the electrical protection of the ESD protected device 106 according to aspects of the present disclosure, and may include diodes, transistors, and/or a combination thereof. The ESD protection device 104 may be located within or proximate the ESD protected device 106 or may be located remote from the ESD protected device 106. Moreover, the arrangement of the ESD protection device 104 relative to the I/O device 102 and the ESD protected device 106 may vary from the illustrated embodiment within the scope of the present disclosure.

Figure 2:
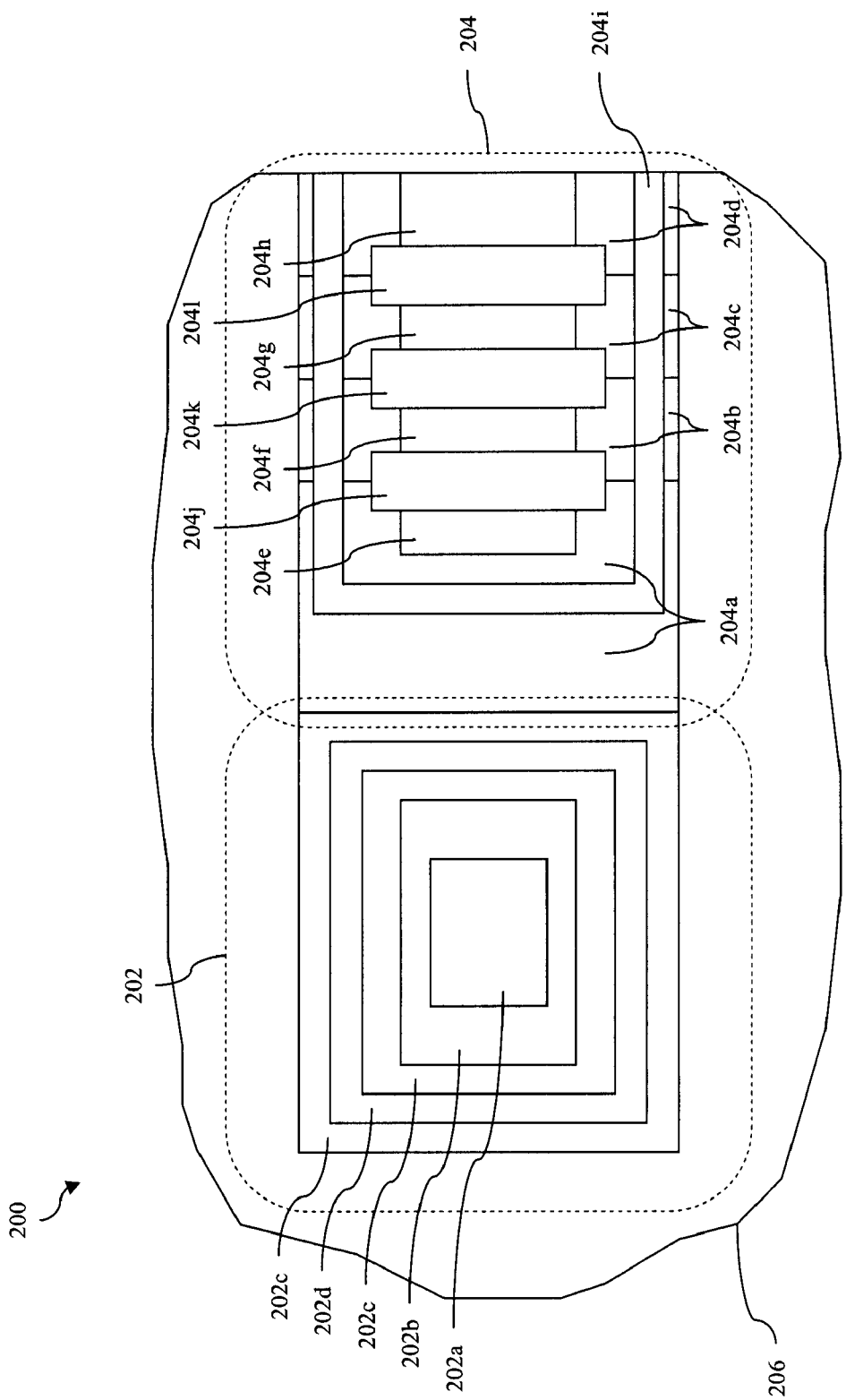
FIG. 2 is a layout view of at least a portion of an embodiment of an electrostatic discharge (ESD) protection device according to aspects of the present disclosure.

Referring to FIG. 2, illustrated is a layout view of at least a portion of one embodiment of an ESD protection device 200 according to aspects of the present disclosure and representing one implementation of the ESD protection device 104 shown in FIG. 1. The ESD protection device 200 includes a substrate 206 having a diode region 202 and an N-type transistor region 204. The diode region 202 and the N-type transistor region 204 are configured to form an ESD protection structure, and may each be adapted for high voltage operation, such as in applications employing an operating voltage of about 12 volts or greater.

The substrate 206 may comprise silicon, gallium arsenide, gallium nitride, strained silicon, silicon germanium, silicon carbide, carbide, diamond, and/or other materials. A bulk portion of the substrate 206 may be doped with a P type dopant. In one embodiment, the substrate 206 comprises a semiconductor-on-insulator (SOI) substrate, such as a silicon-on-sapphire substrate, a silicon germanium-on-insulator substrate, or another substrate comprising an epitaxial semiconductor layer on an insulator layer. The substrate 206 may also or alternatively comprise a fully depleted SOI substrate having an active layer thickness ranging between about 5 nm and about 200 nm. The substrate 206 may also or alternatively comprise an air gap, such as may be formed in a "silicon-on-nothing" (SON) structure.

The diode region 202 includes doped regions 202a-d. The doped region 202a may be a P+ doped region. The doped region 202b may be a P doped region, and may substantially surround all sides of the doped region 202a within the substrate 206, such that a depth of the doped region 202b may be substantially greater than a depth of the doped region 202a. In one embodiment, the depth of the doped region 202b is about twice the depth of the doped region 202a. The doped region 202c may be an N doped region, and may substantially encircle the doped region 202b, such that a depth of the doped region 202c may be substantially similar to the depth of the doped region 202b. The doped region 202d may be an N+ doped region, and may have a ring or annulus-shaped configuration substantially surrounded by the doped region 202c on all sides within the substrate 206, such that a depth of the doped region 202d may be substantially less than the depth of the doped region 202c. In one embodiment, the depth of the doped region 202c is about twice the depth of the doped region 202d.

The transistor region 204 includes doped regions 204a-i and electrodes 204j-l. The doped regions 204a and 204c may be P doped regions, each possibly being substantially similar in depth and/or P dopant concentration to the doped region 202b. The doped region 204a may also abut the doped region 202c. The doped regions 204b and 204d may be N doped regions substantially similar in depth and/or N dopant concentration to the doped region 202c.

The doped regions 204e-h may be N+ doped regions each substantially surrounded on all sides within the substrate 206 by a corresponding one of the doped regions 204a-d, such that a depth of each of the doped regions 204e-h may be substantially less than a depth of each of the doped regions 204a-d. In one embodiment, the depth of the doped regions 204e-h may be about half of the depth of the doped regions 204a-d. The doped region 204i may be a P+ doped region having a ring configuration (only part of which being shown in FIG. 2) substantially surrounding the doped regions 204e-h. The doped region 204i may be separated from the doped regions 204e-h by portions of the doped regions 204a-d, and may also be substantially surrounded on all sides within the substrate by, collectively, the doped regions 204a-d.

The doped regions 202a-d and 204a-i may be formed in the substrate 206 by ion implantation. For example, the doped regions 202a-d and 204a-i may be formed by growing a sacrificial oxide layer on the substrate 206, opening a pattern in the oxide layer for the locations of ones of the doped regions 202a-d and 204a-i, and then employing a chained-implantation procedure through the openings.

Impurities employed to form the doped regions 202c, 202d, 204b, 204d, and 204e-h may comprise phosphorus, arsenic, and/or other materials. Prior and/or subsequent diffusion, annealing, and/or electrical activation processes may also be employed after the impurity is implanted. The doped regions 202a, 202b, 204a, 204c, and 204i may be similarly formed, although possibly with an energy level that is decreased, for example, in proportion to the atomic masses of the N type and P type dopants. P type dopant impurities employed to form the doped regions 202a, 202b, 204a, 204c, and 204i may comprise boron, boron fluoride, indium, and/or other materials. As with the formation of the N doped regions, formation of the P doped regions may include one or more diffusion, annealing, and/or electrical activation processes.

In one embodiment, boron is employed as the P type dopant for the doped regions 202a, 202b, 204a, 204c, and 204i, and deuterium-boron complexes are employed as the N type dopant for the doped regions 202c, 202d, 204b, 204d, and 204e-h. The deuterium-boron complexes may be formed by plasma treatment of boron-doped diamond layers with a deuterium plasma.

The electrodes 204j-l may be substantially similar to transistor gate electrodes physically separated from the substrate 206 by one or more layers of oxide or other insulating materials. The electrodes 204j-l may comprise polysilicon and/or other conductive materials, and may be formed by chemical-vapor deposition (CVD), plasma-enhanced CVD (PECVD), physical-vapor deposition (PVD), atomic layer deposition (ALD), and/or other processes.

Figure 3:
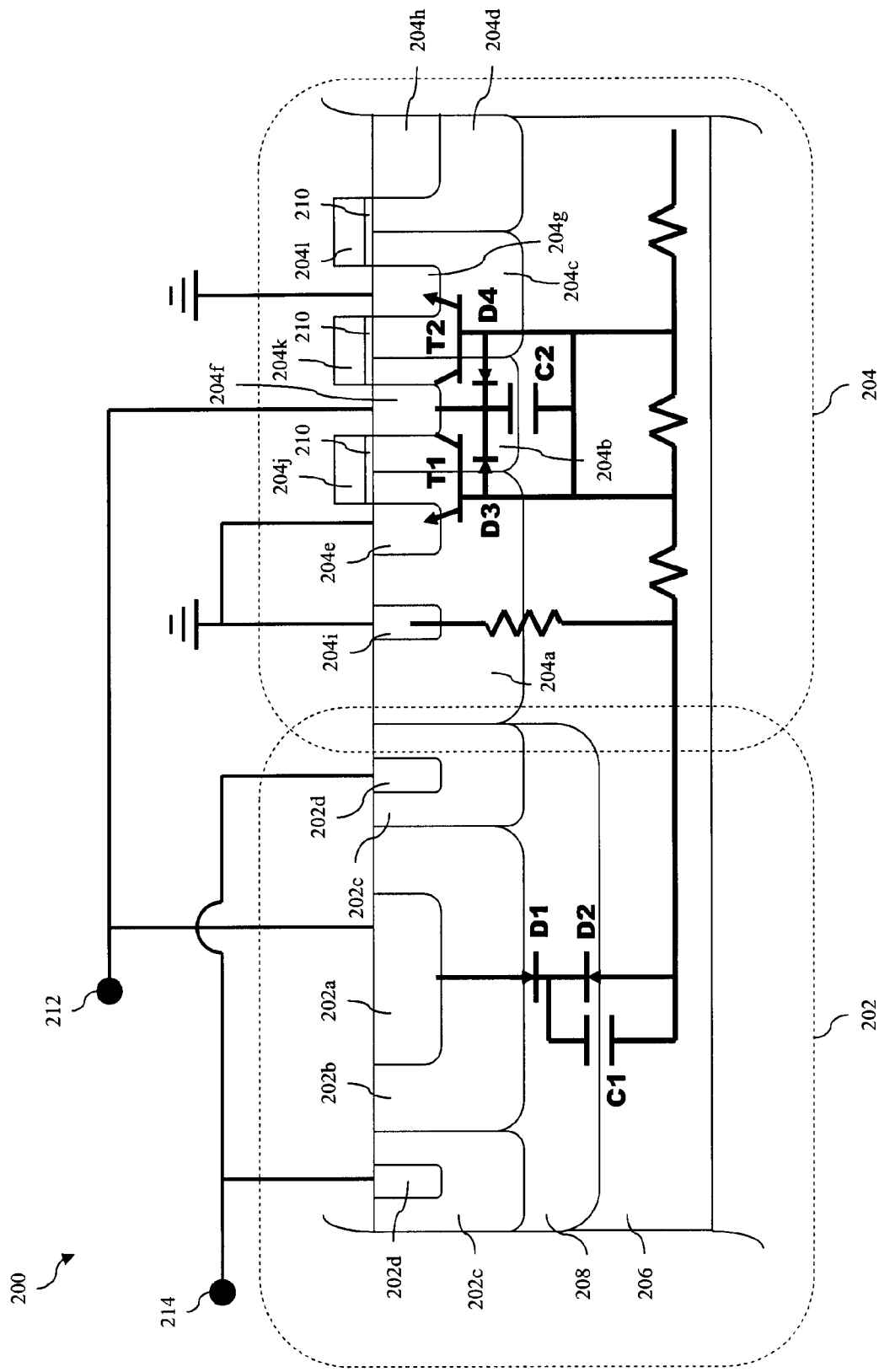
FIG. 3 is sectional view of the ESD protection device shown in FIG. 2.

Referring to FIG. 3, illustrated is a sectional view of one embodiment of the ESD protection device 200 shown in FIG. 2. The doped region 202a is substantially enclosed within the substrate 206 by the doped region 202b, thereby having a depth that is substantially greater than the depth of the doped regions 202a-d. However, although not visible in FIG. 2, the device 200 may also include another doped region 208 visible in the sectional view of FIG. 3. The doped region 208 may be a buried N doped layer or region, possibly having a dopant concentration substantially similar to the dopant concentration of the doped regions 202c, 204b, and 204d. In one embodiment, the dopant concentration of the doped region 302 is substantially similar to the dopant concentration of the doped regions 202d and 204e-h. The impurities employed to form the doped region 208 may be substantially similar to the impurities employed to form the doped regions 202c, 202d, 204b, 204d, and 204e-h.

FIG. 3 also more clearly illustrates the existence of dielectric layers 210 interposing the electrodes 204j-l and the substrate 206. The dielectric layers 210 may each include one or more layers comprising silicon dioxide and/or other materials, and may be formed by thermal oxidation, CVD, PVD, ALD, and/or other processes.

The electrodes 204j-l overlying the insulating layers 210 may substantially extend laterally between heavily doped regions of the substrate 206. For example, the electrode 204j may extend laterally over the substrate 206 to substantially cover the portion of the doped region 204a interposing the doped regions 204e and 204b, and may also substantially cover the portion of the doped region 204b interposing the doped regions 204a and 204f. Thus, the electrode 204j may substantially span the distance separating the doped regions 204e and 204f. In one embodiment, the electrode 204j may also extend beyond the doped regions 204e and 204f, thereby overlapping the doped regions 204e and 204f. The electrodes 204k and 204l may be similarly formed. For example, the electrode 204k may substantially span or overlap the distance separating the doped regions 204f and 204g, and the electrode 240l may substantially span or overlap the distance separating the doped regions 204g and 204h.

As mentioned above, the diode region 202 and the transistor region 204 may form an ESD protection structure, the equivalent circuit of which is schematically shown in FIG. 3. In the diode region 202, a parasitic diode D1 is formed between P doped region 202b (or P doped region 202a) and N doped region 208. A reversed parasitic diode D2 and capacitor C1 are formed between N doped region 208 and P doped substrate 206. In the transistor region 204, a parasitic bipolar transistor T1 may be formed substantially therein, in which the doped region 204e functions as the collector of the transistor TI, at least one of the doped regions 204b and 204f function as the emitter, and the doped region 204a functions as the base. Similarly, another parasitic bipolar transistor T2 may be formed substantially in the transistor region 204, wherein the doped region 204g functions as the collector of the transistor T2, at least one of the doped regions 204b and 204f function as the emitter, and the doped region 204c functions as the base. Furthermore, a diode D3 is formed between doped regions 204a and 204b. Another diode D4 is formed between the doped regions 204b and 204c. A capacitor C2 is also formed between the doped region 204b and the substrate 206.

The doped region 204f in the transistor region 204 and the doped region 202a in the diode region 202 may be coupled to a voltage source 212, such as an input or a $V_{dd}$ contact. In one embodiment, the doped regions 202a and 204f may be coupled to an input device, such as the device 102 shown in FIG. 1. The doped region 202d may be connected to a voltage source 214, or may be biased at a floating potential. The doped regions 204i, 204e, and 204g may be grounded.

The mentioned ESD protection structure may work through two stages during an ESD zapping event. Unlike MOS transistors which are surface devices, the bipolar transistors T1 and T2 are bulk devices, and are capable of handling large currents if turned on, which is also referred to as snapback conduction. However, during high voltage applications, the turn-on threshold voltage to the two bipolar transistors T1 and T2 may be too high such that the core devices (such as high voltage MOS transistors and/or the transistor region 204) may be damaged even before the transistors T1 and T2 are turned on.

Thus, parasitic diodes D1 to D4 and capacitors C1 to C2 are coupled and configured to provide further ESD protection before the transistors T1 and T2 are turned on. For a pad under ESD or Vss zapping event, the reversed diodes D3 and D4 with capacitor C2 could form a path from the pad to the substrate 206 to discharge large zapping current. The reversed diode D1 and capacitance C1 provide an additional discharge path to eliminate the current from being localized in the reversed diodes D3 and D4. Unlike HVNMOS only using the avalanche breakdown current of the reversed diodes D3 and D4 to turn on its parasitic npn bipolar transistors T1 and T2, the diode region 202 provides additional current path to the substrate to turn on the parasitic npn bipolar transistors T1 and T2. Thus, parasitic capacitors and diodes in both the diode region 202 and the transistor region 204 can prevent the core devices (including high voltage MOS transistors and/or the high voltage NMOS transistor (HVNMOS) in the transistor region 204) from being damaged by the ESD before the parasitic npn bipolar transistors T1 and T2 are turned on.

The N-type transistor region 204, with cooperation of the diode region 202, provides ESD protection in high voltage application through two stages. In the first stage, the parasitic diodes and capacitors in both the diode region 202 and the transistor region 204 are turned on to provide current path from the input pad to the substrate 206. In the second stage, the parasitic bipolar transistors are turned for large current path through the bipolar transistors. Furthermore, the transistor region 204 may comprise more doped regions and gates, referred to as multi-finger structure, for ESD discharge efficiency.

The doped regions including 202b, 204a, and 204c may be P doped well regions configured for high voltage applications, referred to as high voltage P-well (HVPW). The doped regions including 202c, 204b, and 204d may be N doped well regions configured for high voltage applications, referred to as high voltage N-well (HVNW). Additional related description and details are provided below.

One aspect by which the device 200 is configured for high-voltage operations is also more clearly illustrated in FIG. 3. That is, each of the connections of voltage sources (212 or 214) to the device 200 may comprise a double-doped region. For example, in the illustrated embodiment, the voltage source 212 contacts the doped regions 202a and 204f, which may each be heavily doped regions substantially enclosed within lesser doped regions 202b and 204b, respectively, of the same dopant type. In one embodiment, the more heavily doped regions 202a and 204f may be formed employing an impurity dosage ranging between about $1 \times 10^{15}$ atoms/cm$^2$ and about $5 \times 10^{15}$ atoms/cm$^2$ and an implant energy ranging between about 40 keV and about 80 keV, whereas the doped regions 202b and 204b may formed employing an impurity dosage ranging between about $1 \times 10^{13}$ atoms/cm$^2$ and about $5 \times 10^{14}$ atoms/cm$^2$ and an implant energy ranging between about 30 keV and about 50 keV. For example, the dopant concentration of the doped regions 202a and 204f may be at least about 100% greater than the dopant concentration of the doped regions 202b and 204b.

Figure 4:
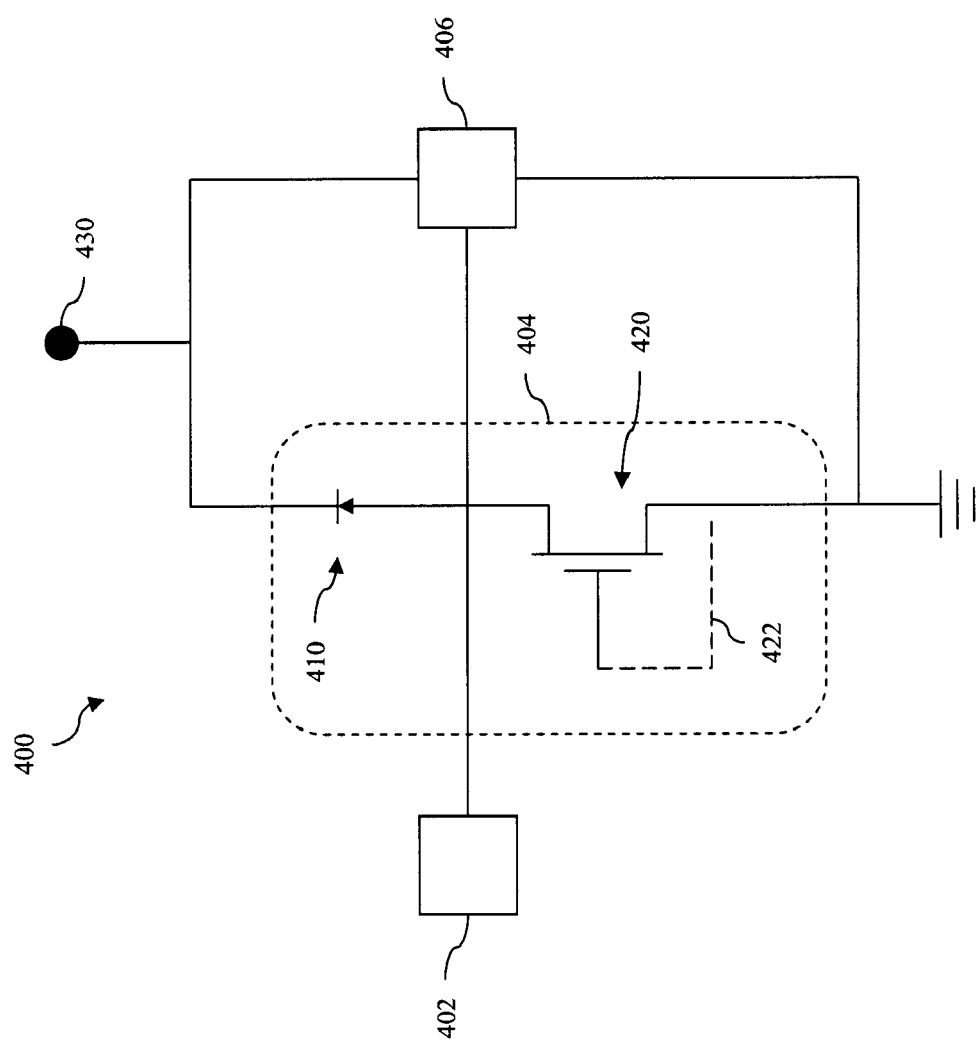
FIG. 4 is a schematic view of at least a portion of an embodiment of an ESD protection device according to aspects of the present disclosure.

Referring to FIG. 4, illustrated is a schematic view of at least a portion of one embodiment of an integrated circuit device 400 representing one implementation of the protection ESD device 200 shown in FIGS. 2 and 3. The integrated circuit 400 may be substantially similar to the device 100 shown in FIG. 1, wherein the ESD protection device 104 of FIG. 1 is replaced with the ESD protection device 200 of FIGS. 2 and 3.

For example, the device 400 includes an input device 402 and an ESD protected device 406 that may be substantially similar to the input device 102 and ESD protected device 106, respectively, shown in FIG. 1. The device 400 also includes an ESD protection device 404 that is substantially similar to the device 200 shown in FIGS. 2 and 3. However, in FIG. 4, the ESD protection device 404 is modeled as a high-voltage diode 410 and an N-type high-voltage transistor 420.

The diode 410 is coupled between a voltage source 430 and the input device 402, such that a potentially damaging positive voltage at the device 402 will be redirected away from the ESD protected device 406. The voltage source 430 may be a floating potential or may provide a predetermined potential such as Vdd or adjustable potential for tuning the threshold voltage of the diode 410. The transistor 420 is coupled between the input device 402 and ground, such that a potentially-damaging negative voltage at the device 402 will also be redirected away from the ESD protected device 406. The gate of the transistor 420 may be grounded, such as by a connector 422, or the gate may be otherwise biased (e.g., below a threshold and/or operating voltage) to maintain the transistor 420 in an "off" state until a potentially-damaging negative voltage occurs at the device 402.

Figure 5:
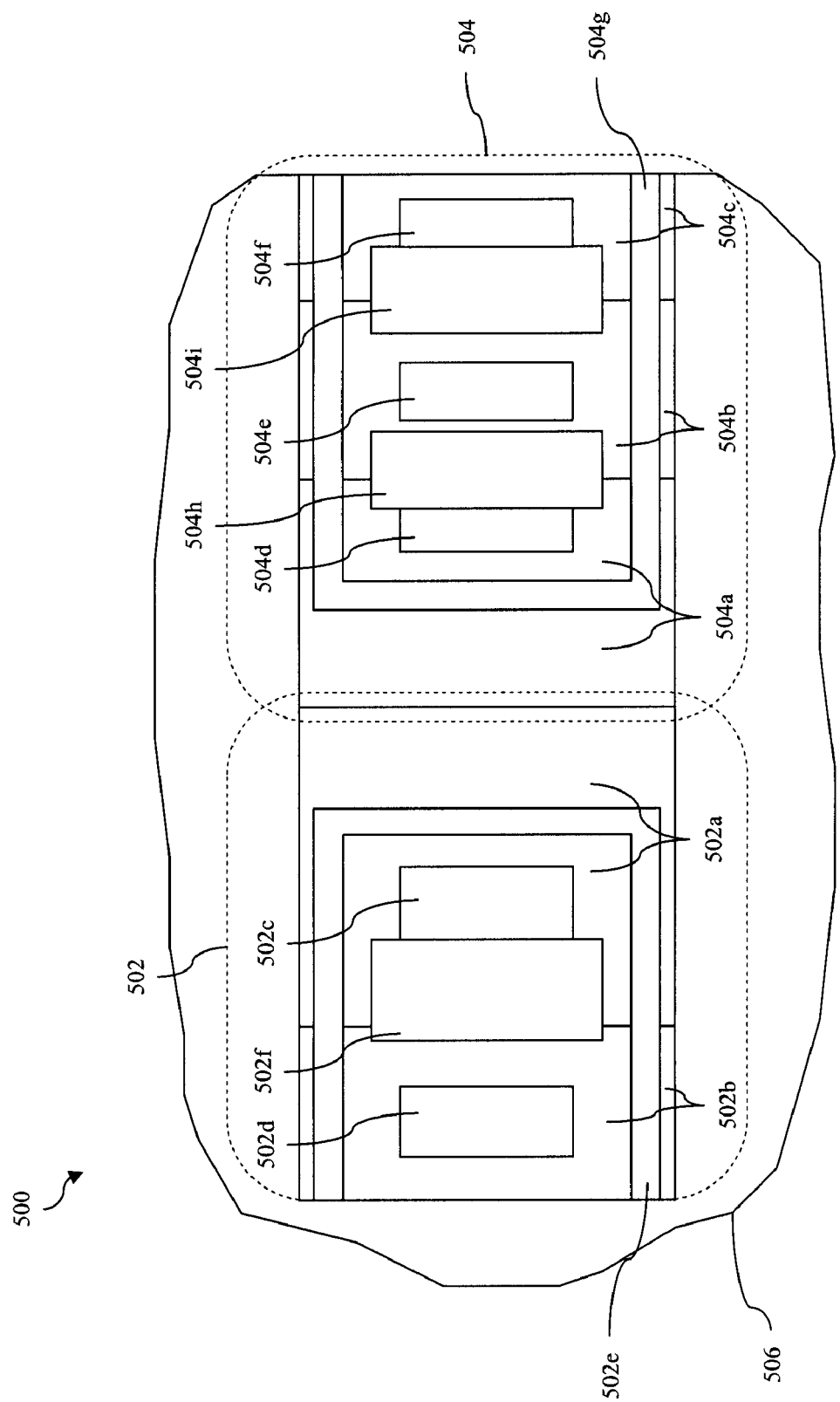
FIG. 5 is a layout view of at least a portion of an embodiment of an ESD protection device according to aspects of the present disclosure.

Referring to FIG. 5, illustrated is a layout view of at least a portion of one embodiment of an ESD protection device 500 according to aspects of the present disclosure and representing one implementation of the ESD protection device 104 shown in FIG. 1. The ESD protection device 500 includes a substrate 506 having an NMOS or N-type transistor region 502 and a PMOS or P-type transistor region 504. The N-type transistor region 502 and the P-type transistor region 504 are configured to form an ESD protection structure, and may each be adapted for high voltage operation, such as in applications employing an operating voltage of about 12 volts or greater.

The substrate 506 may be substantially similar to the substrate 206 of FIGS. 2 and 3 in material, structure, and processing.

The N-type transistor region 502 includes doped regions 502a-e and an electrode 502f. The doped region 502a may be a P doped region. The doped region 502b may be an N doped region, and may substantially surround all sides of the doped region 502a within the substrate 506. The doped region 502c may be an N+ doped region, and may substantially be surrounded by the doped region 502a on all sides within the substrate 506, such that a depth of the doped region 502c may be substantially less than the depth of the doped region 502a. The doped region 502d may be an N+ doped region, and may substantially be surrounded by the doped region 502b, such that a depth of the doped region 502d may be substantially less than the depth of the doped region 502b. In one embodiment, the depth of the doped region 502b (502a) is about twice the depth of the doped region 502d (502c).

The P-type transistor region 504 includes doped regions 504a-g and electrodes 504h-504i. The doped regions 504a and 504c may be N doped regions, each possibly being substantially similar in depth and/or N dopant concentration to the doped region 502b. The doped region 504a may also abut the doped region 502a. The doped region 504b may be P doped region substantially similar in depth and/or P dopant concentration to the doped region 502a. The doped region 502e may be a P+ doped region having a ring configuration (only part of which being shown in FIG. 5) substantially surrounding the doped regions 502c-d. The doped region 502e may be separated from the doped regions 502c-d by portions of the doped regions 502a-b, and may also be substantially surrounded on all sides within the substrate by, collectively, the doped regions 502a-b.

The doped regions 504d-f may be P+ doped regions each substantially surrounded on all sides within the substrate 506 by a corresponding one of the doped regions 504a-c, such that a depth of each of the doped regions 504d-f may be substantially less than a depth of each of the doped regions 504a-c. In one embodiment, the depth of the doped regions 504d-f may be about half of the depth of the doped regions 504a-c. The doped region 504g may be a N+ doped region having a ring configuration (only part of which being shown in FIG. 5) substantially surrounding the doped regions 504d-f. The doped region 504g may be separated from the doped regions 504d-f by portions of the doped regions 504a-c, and may also be substantially surrounded on all sides within the substrate by, collectively, the doped regions 504a-c. The doped regions 502a-e and 504a-g may be formed in the substrate 506 by ion implantation substantially similar to forming the 202a-d and 204a-i. The electrodes 502f and 504h-i may be substantially similar to transistor gate electrodes physically separated from the substrate 506 by one or more layers of oxide or other insulating materials.

Figure 6:
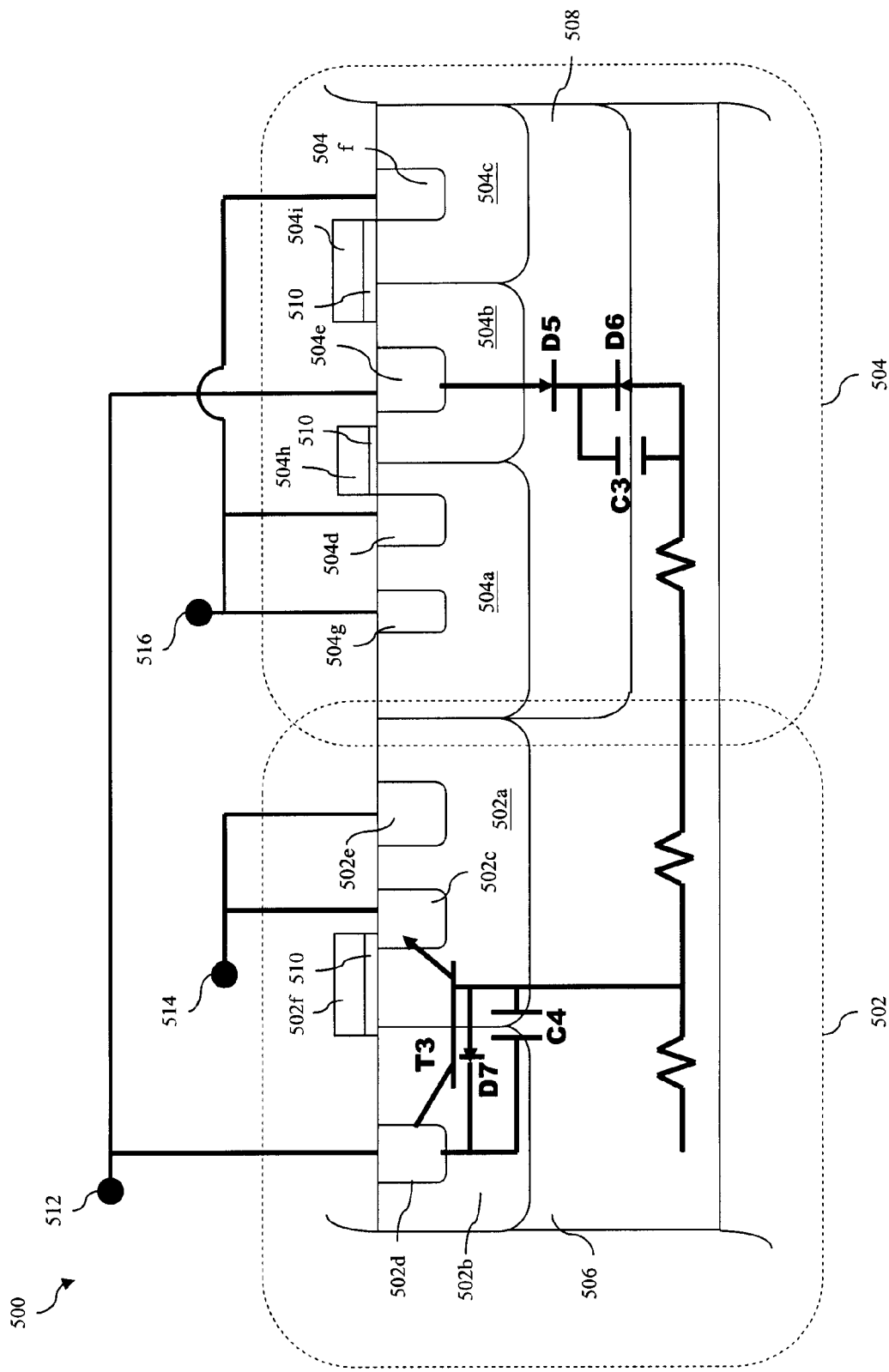
FIG. 6 is sectional view of the ESD protection device shown in FIG. 5.

Referring to FIG. 6, illustrated is a sectional view of at least a portion of one embodiment of the ESD protection device 500 shown in FIG. 5. The N-type transistor region 502c is substantially enclosed within the substrate 506 by the doped region 502a. However, although not visible in FIG. 5, the device 500 may also include another doped region 508 visible in the sectional view of FIG. 6. In one embodiment, the doped region 508 may be a buried N doped layer or region, possibly having a dopant concentration substantially similar to the dopant concentration of the doped regions 502b, 504a, and 504c. The impurities employed to form the doped region 508 may be substantially similar to the impurities employed to form the doped regions 502b, 502c, 502d, 504a, 504c, and 504g.

FIG. 6 also more clearly illustrates the existence of dielectric layers 510 interposing the electrodes 502f or 504h-i and the substrate 506. The dielectric layers 510 may each include one or more layers comprising silicon dioxide and/or other materials, and may be formed by thermal oxidation, CVD, PVD, ALD, and/or other processes. The electrodes 502f or 504h-i overlying the insulating layers 510 may substantially extend laterally between heavily doped regions of the substrate 506.

Figure 7:
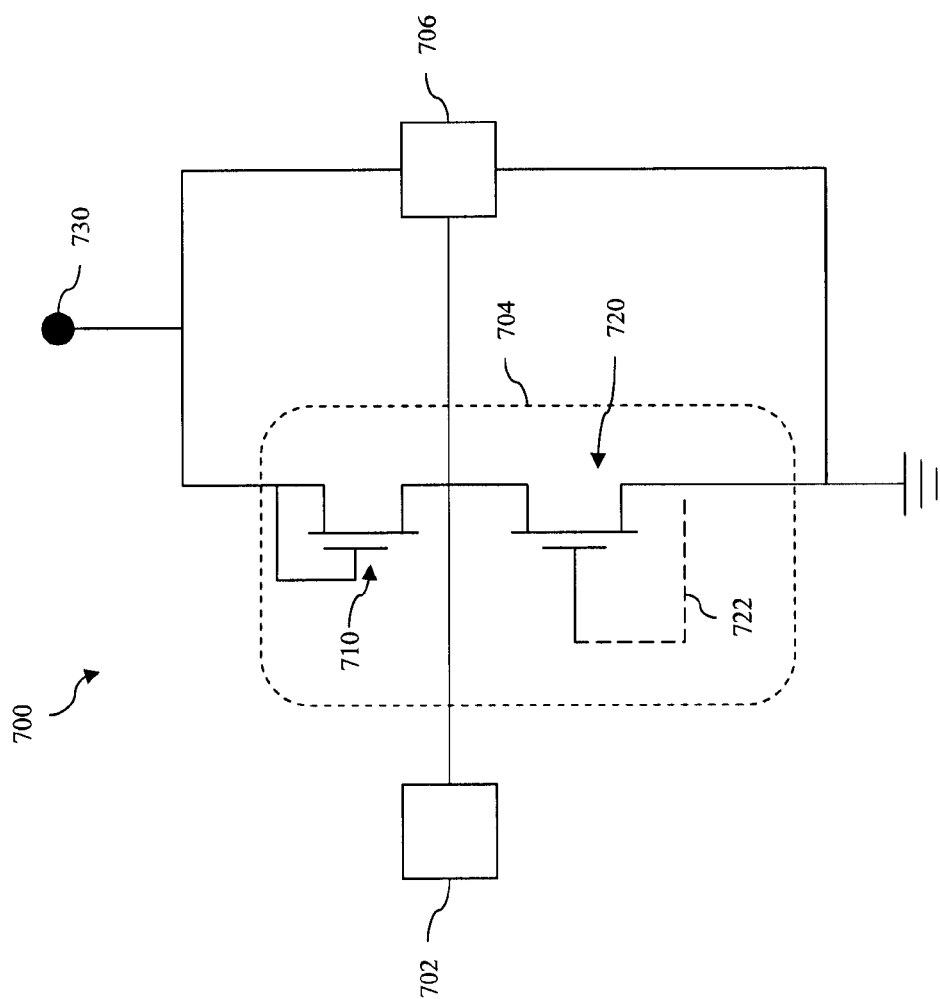
FIG. 7 is a schematic view of at least a portion of an embodiment of an ESD protection device according to aspects of the present disclosure.

As mentioned above, the N-type transistor region 502 and the P-type transistor region 504 may form an ESD protection structure, the equivalent circuit of which is schematically shown in FIG. 7. In the N-type transistor region 502, a parasitic bipolar transistor T1 may be formed substantially therein, in which the doped region 502c functions as the collector of the transistor T3, at least one of the doped regions 504b and 504d functions as the emitter, and the doped region 502a functions as the base. A parasitic capacitor C4 and a parasitic diode D7 are formed between the doped regions 502a and 502b in the N-type transistor region 502. In the P-type transistor region 504, a parasitic diode D5 is formed between P doped region 504b (or P doped region 504e) and N doped region 508. A reversed parasitic diode D6 and capacitor C3 are formed between N doped region 508 and P doped substrate 506.

The doped region 502d in the N-type transistor region 502 and the doped region 504e in the P-type transistor region 504 may be coupled to a voltage source 512, such as an input or a $V_{dd}$ contact. In one embodiment, the doped regions 502d and 504e may be coupled to an input device, such as the device 102 shown in FIG. 1. The doped region 502e may be biased at a floating potential. The doped regions 504g, 504d, and 504f may be grounded, such as through a common contact or conductor 516.

The mentioned ESD protection structure 500 may work through two stages during an ESD zapping event, similarly to the ESD protection structure 200 of FIGS. 2 and 3. In the first stage, the parasitic capacitor C4 and parasitic diode D7 in the N-type transistor region 502 provide an ESD discharge path from the input devices, such as the voltage source 512 to the substrate 506. Furthermore, the parasitic capacitor C3 and parasitic diodes D5 and D6 in the P-type transistor region 504 provide an additional ESD discharge path from the input devices to the substrate 506. In the second stage, the parasitic bipolar transistor T3 is turned on, and large current induced by an ESD zapping event can be discharged therethrough. Thus, parasitic diodes D5 to D7 and capacitors C3 to C4 are coupled and configured to provide further ESD protection before the bulk transistor T3 is turned on.

Referring to FIG. 7, illustrated is a schematic of at least a portion of one embodiment of an integrated circuit device 700 according to aspects of the present disclosure and representing one implementation of the protection ESD device 500 shown in FIGS. 5 and 6. The integrated circuit 700 may be substantially similar to the device 100 shown in FIG. 1, wherein the ESD protection device 104 of FIG. 1 is replaced with the ESD protection device 500 of FIGS. 5 and 6.

For example, the device 700 includes an input device 702 and an ESD protected device 706 that may be substantially similar to the input device 102 and ESD protected device 106, respectively, shown in FIG. 1. The device 700 also includes an ESD protection device 704 that is substantially similar to the device 500 shown in FIGS. 5 and 6. However, in FIG. 7, the ESD protection device 704 is modeled as a P-type high-voltage transistor (PMOS) 710 and an N-type high-voltage transistor (NMOS) 720.

Similar to the device 400 of FIG. 4, the PMOS 710 is coupled between a voltage source 730 and the input device 702, such that a potentially-damaging positive voltage at the device 702 will be redirected away from the ESD protected device 706. The voltage source 730 may be a floating potential. The transistor 720 is coupled between the input device 402 and ground, such that a potentially damaging negative voltage at the device 702 will also be redirected away from the ESD protected device 706. The gate of the transistor 720 may be grounded, such as by a connector 722, or the gate may be otherwise biased (e.g., below a threshold and/or operating voltage) to maintain the transistor 720 in an "off" state until a potentially damaging negative voltage occurs at the device 702.

Figure 8:
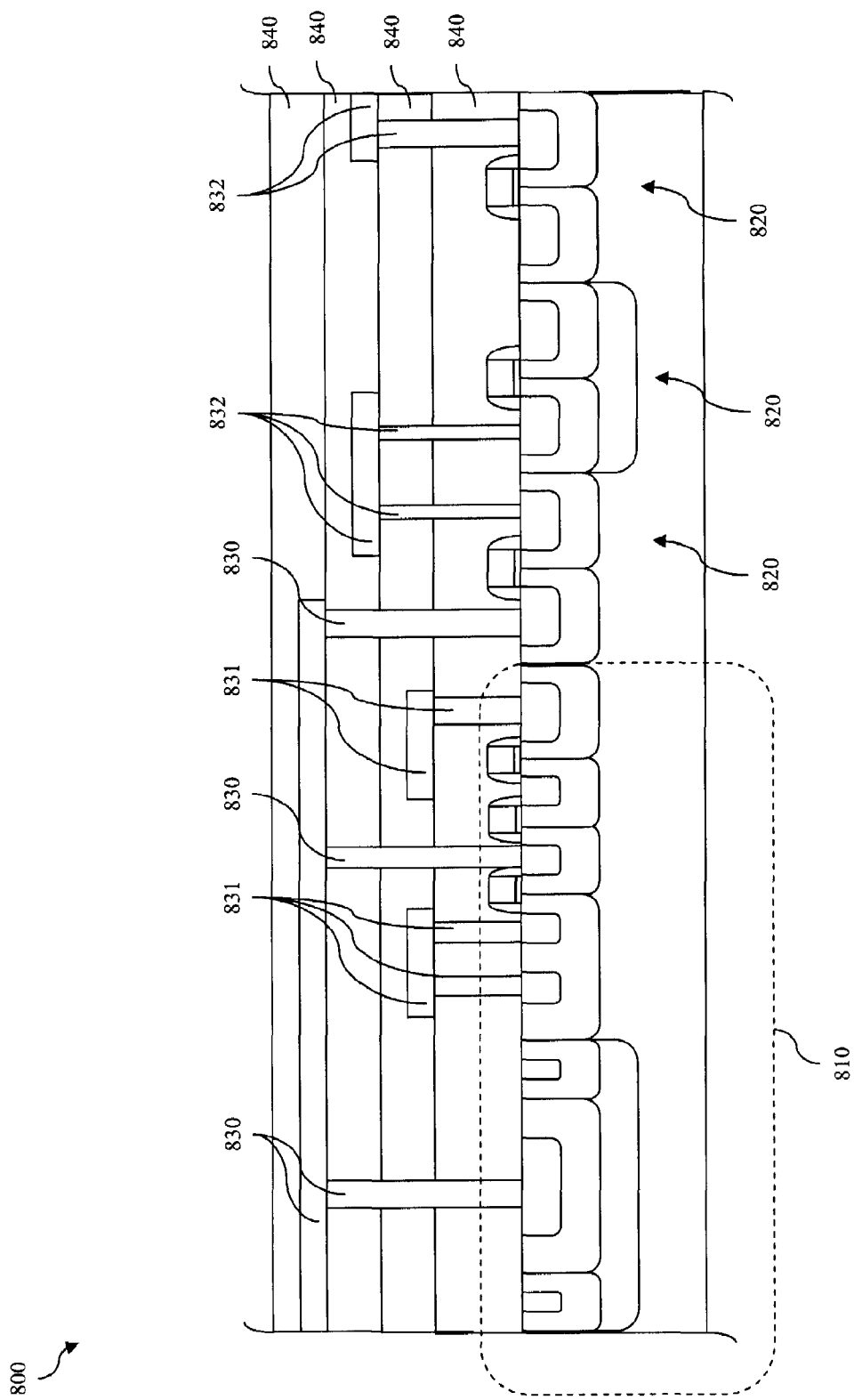
FIG. 8 is a sectional view of at least a portion of an embodiment of an integrated circuit device according to aspects of the present disclosure.

Referring to FIG. 8, illustrated is a sectional view of at least a portion of an embodiment of an integrated circuit device 800 according to aspects of the present disclosure. The device 800 includes an ESD protection device 810 and a plurality of microelectronic devices 820 to be protected by the ESD protection device 810. The ESD protection device 810 may be or comprise the ESD protection device 200 of FIGS. 2, 3, and/or 4. Alternatively, the ESD protection device 810 may be or comprise the ESD protection device 500 of FIGS. 5, 6, and/or 7. In one embodiment, the integrated circuit device 800 includes more than one ESD protection device 810, possibly including one device similar to the ESD protection device 200 and another device similar to the ESD protection device 500. The microelectronic devices 820 may be or comprise one or more transistors, diodes, and/or other devices, and may be substantially similar to the ESD protected device 106 shown in FIG. 1.

The integrated circuit device 800 also includes a plurality of interconnects 830-832 extending along and/or through one or more insulating layers 840. The interconnects 830-832 may comprise copper, aluminum, tungsten, tantalum, titanium, nickel, cobalt, metal silicide, metal nitride, poly silicon, and/or other materials, possibly including one or more refractory layers or linings, and may be formed by CVD, PVD, ALD, plating, and/or other processes. The insulating layers 840 may comprise silicon dioxide, fluorinated silicon glass (FSG), SILK (a product of Dow Chemical of Michigan), BLACK DIAMOND (a product of Applied Materials of Santa Clara, Calif.), and/or other insulating materials, and may be formed by CVD, ALD, PVD, spin-on coating, and/or other processes.

The interconnects 830 may interconnect the ESD device 810 and one or more of the microelectronic devices 820. Thus, for example, power supplied via the interconnects 830 may be directed to the microelectronic devices 820 unless the power spikes or surges to an excessive positive or negative potential, at which time all or a portion of the power may be directed to the ESD device 810. The interconnects 831 may ground one or more doped regions or contacts of the ESD device 810, such as is described above with respect to FIG. 3, among others. The interconnects 832 may interconnect ones of the microelectronic devices 820 and/or other devices integral to, proximate, or remote from those shown in FIG. 8.

Thus, the present disclosure provides an ESD protection device including, in one embodiment, a diode (PMOS in another embodiment)located in a substrate and an NMOS device located in the substrate adjacent the diode, wherein at least portions of the NMOS device provides parasitic bipolar transistors for ESD discharge. Both the diode (or PMOS) and the NMOS provide parasitic capacitors and diodes for ESD discharge before the parasitic bipolar transistors are turned on. One or both of the diode (PMOS) and the MOS device may be high voltage devices, possibly having a threshold and/or operating voltage of at least about 12 volts.

The present disclosure also provides an ESD protection device having a first N doped region located in a P doped substrate, a first P doped region located in the first N doped region, and a first P+ doped region located in the first P doped region and substantially surrounded on all sides within the substrate by the first P doped region. A second N doped region is located in the first N doped region and substantially surrounds the first P doped region, wherein the second N doped region and the first P doped region have substantially similar depths. A first N+ doped region is located in the second N doped region and is substantially surrounded on all sides within the substrate by the second N doped region. A second P doped region is located in the substrate adjacent the first N doped region. A second N+ doped region is located in the second P doped region and is substantially surrounded on all sides within the substrate by the second P doped region. A third N doped region is located in the substrate adjacent the second P doped region. A third N+ doped region is located in the third N doped region and is substantially surrounded on all sides within the substrate by the third N doped region. A third P doped region is located in the substrate adjacent the third N doped region. A fourth N+ doped region is located in the third P doped region and is substantially surrounded on all sides within the substrate by the third P doped region. A second P+ doped region is located in the second and third P doped regions and the third N doped region and substantially surrounds the second, third, and fourth N+ doped regions. An electrode is located over the substrate and laterally interposes the third and fourth N+ doped regions, wherein the electrode laterally extends from between the third and fourth N+ doped regions at least to at least one of the third and fourth N+ doped regions.

A method of manufacturing an ESD protection device is also introduced in the present disclosure. In one embodiment, the method includes forming a first N doped region to a first depth in a P doped substrate, forming a first P doped region to a second depth within the first N doped region, wherein the second depth is substantially less than the first depth, and forming a first P+ doped region to a third depth within the first P doped region, wherein the third depth is substantially less than the second depth. A second N doped region is formed to the second depth within the first N doped region and substantially laterally surrounding the first P doped region. A first N+ doped region is formed to the third depth in an annulus shape within the second N doped region. A second P doped region is formed to the second depth within the substrate and adjacent the second N doped region. A second N+ doped region is formed to the third depth within the second P doped region. A third N doped region is formed to the second depth within the substrate and adjacent the second P doped region. A third N+ doped region is formed to the third depth within the third N doped region. A third P doped region is formed to the second depth within the substrate and adjacent the third N doped region. A fourth N+ doped region is formed to the third depth within the third P doped region. An electrode is formed over the substrate and extending at least between the third and fourth N+ doped regions.

The foregoing has outlined features of several embodiments according to aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. A method of manufacturing an apparatus, comprising:

forming a first N doped region to a first depth in a P doped substrate;

forming a first P doped region to a second depth within the first N doped region, wherein the second depth is substantially less than the first depth;

forming a first P+ doped region to a third depth within the first P doped region, wherein the third depth is substantially less than the second depth;

forming a second N doped region to the second depth within the first N doped region and substantially laterally surrounding the first P doped region;

forming a first N+ doped region to the third depth in an annulus shape within the second N doped region;

forming a second P doped region to the second depth within the substrate and adjacent the second N doped region;

forming a second N+ doped region to the third depth within the second P doped region;

forming a third N doped region to the second depth within the substrate and adjacent the second P doped region;

forming a third N+ doped region to the third depth within the third N doped region;

forming a third P doped region to the second depth within the substrate and adjacent the third N doped region;

forming a fourth N+ doped region to the third depth within the third P doped region; and forming an electrode over the substrate and extending at least between the third and fourth N+ doped regions.

2. The method of claim 1 wherein the electrode is a first electrode, the method further comprising forming a second electrode over the substrate and extending at least between the second and third N+ doped regions.

3. The method of claim 1 wherein dopant concentrations of the first P doped region and the first P+ doped region differ by at least about 100%.

4. The method of claim 1 wherein dopant concentrations of the second N doped region and the first N+ doped region differ by at least about 100%.

5. The method of claim 1 wherein dopant concentrations of the third N doped region and the third N+ doped region differ by at least about 100%.

* * * * *